(12) United States Patent
Marty et al.

(10) Patent No.: US 8,963,273 B2
(45) Date of Patent: Feb. 24, 2015

(54) BACK-SIDE ILLUMINATED IMAGE SENSOR WITH A JUNCTION INSULATION

(71) Applicants: STMicroelectronics S.A., Montrouge (FR); STMicroelectronics (Crolles 2) SAS, Crolles (FR)

(72) Inventors: Michel Marty, Saint Paul de Varces (FR); François Roy, Seyssins (FR); Jens Prima, Siegen (DE)

(73) Assignees: STMicroelectronics S.A., Montrouge (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/247,084

(22) Filed: Apr. 7, 2014

(65) Prior Publication Data

US 2014/0217541 A1    Aug. 7, 2014

Related U.S. Application Data

(62) Division of application No. 13/445,199, filed on Apr. 12, 2012, now Pat. No. 8,703,528.

(30) Foreign Application Priority Data

Apr. 12, 2011 (FR) ..................................... 11 53183

(51) Int. Cl.
*H01L 31/00* (2006.01)
*H01L 27/146* (2006.01)

(52) U.S. Cl.
CPC ........ *H01L 27/1464* (2013.01); *H01L 27/1463* (2013.01); *H01L 27/14687* (2013.01); *H01L 27/14689* (2013.01); *H01L 27/14683* (2013.01)

USPC ............. 257/447; 257/480; 257/483; 438/57; 438/96

(58) Field of Classification Search
USPC ............... 257/447, 480, 481, 483; 438/57, 96
See application file for complete search history.

(56) References Cited

U.S. PATENT DOCUMENTS

| 2,200,084 | A | 5/1940 | Hibbard |
| 7,461,558 | B2 | 12/2008 | Silverbrook et al. |

(Continued)

FOREIGN PATENT DOCUMENTS

| EP | 1995783 A2 | 11/2008 |
| WO | WO 2009023603 A1 | 2/2009 |

OTHER PUBLICATIONS

French Search Report and Written Opinion dated Sep. 14, 2011 from corresponding French Application No. 11/53183.

(Continued)

*Primary Examiner* — Phuc Dang
(74) *Attorney, Agent, or Firm* — Seed IP Law Group PLLC

(57) ABSTRACT

A method for forming a back-side illuminated image sensor, including the steps of: a) forming, from the front surface, doped polysilicon regions, of a conductivity type opposite to that of the substrate, extending in depth orthogonally to the front surface and emerging into the first layer; b) thinning the substrate from its rear surface to reach the polysilicon regions, while keeping a strip of the first layer; c) depositing, on the rear surface of the thinned substrate, a doped amorphous silicon layer, of a conductivity type opposite to that of the substrate; and d) annealing at a temperature capable of transforming the amorphous silicon layer into a crystallized layer.

8 Claims, 2 Drawing Sheets

(56) References Cited

U.S. PATENT DOCUMENTS

| | | | |
|---|---|---|---|
| 7,875,918 | B2 | 1/2011 | Venezia et al. |
| 7,964,916 | B2 | 6/2011 | Or-Bach et al. |
| 8,159,049 | B2 * | 4/2012 | Hietanen ................. 257/621 |
| 8,329,503 | B1 * | 12/2012 | Nielson et al. ............. 438/98 |
| 2004/0182433 | A1 * | 9/2004 | Terakawa et al. ........... 136/255 |
| 2007/0052056 | A1 | 3/2007 | Doi et al. |
| 2009/0315132 | A1 | 12/2009 | Kohyama |
| 2010/0123069 | A1 | 5/2010 | Mao et al. |
| 2010/0148289 | A1 | 6/2010 | Mccarten et al. |
| 2010/0193845 | A1 | 8/2010 | Roy et al. |
| 2010/0237451 | A1 | 9/2010 | Murakoshi |
| 2011/0012248 | A1 | 1/2011 | Reichenbach et al. |
| 2012/0006396 | A1 * | 1/2012 | Cotte et al. ................. 136/256 |

OTHER PUBLICATIONS

French Search Report and Written Opinion dated Sep. 14, 2011 from related French Application No. 11/53179.

French Search Report and Written Opinion dated Sep. 15, 2011 from related French Application No. 11/53178.

French Search Report and Written Opinion dated Sep. 12, 2011 from related French Application No. 11/53177.

* cited by examiner

BACK-SIDE ILLUMINATED IMAGE SENSOR WITH A JUNCTION INSULATION

CROSS REFERENCE TO RELATED APPLICATIONS

This application is a division of U.S. patent application Ser. No. 13/445,199, filed on Apr. 12, 2012, which was issued as U.S. Pat. No. 8,703,528 and claims the priority benefit of French patent application Ser. No. 11/53183, filed on Apr. 12, 2011, entitled "Back side illuminated image sensor with a junction insulation", which applications are hereby incorporated by reference to the maximum extent allowable by law.

BACKGROUND

1. Technical Field

The present invention relates to a method for forming a back-side illuminated image sensor. It also relates to a sensor formed according to this method.

2. Discussion of the Related Art

FIG. 1 is a cross-section view schematically and partially showing a back-side illuminated image sensor 1, formed inside and on top of a thinned semiconductor substrate 3. In this example, substrate 3 is of type P. Its thickness for example ranges between 1 and 10 μm. On the rear surface side of the substrate, a heavily-doped P-type strip 5 extends from the rear surface of substrate 3 and across a thickness approximately ranging from 10 to 100 nm. Strip 5 is itself coated with a heavily-doped N-type strip 6 of similar thickness. Insulation regions 7 extend from the front surface of the substrate and perpendicularly to this surface and form partitions delimiting, in top view (not shown), a plurality of rectangular substrate portions 3a and 3b. Each region 3a comprises at least one photodiode and may comprise charge transfer devices (not shown), corresponding to a sensor pixel, and each region 3b comprises one or several control transistors (not shown). The front surface of the substrate is coated with a stack 9 of insulating and conductive layers in which various interconnections of the sensor are formed. On the rear surface side, a thin insulating layer 11, for example, made of silicon oxide, covers strip 6. Layer 11 is itself coated with an antireflection layer 13, for example formed of a stack of several transparent dielectric layers of different indexes. Antireflection layer 13 is topped with juxtaposed color filters, altogether forming a filtering layer 15. In the shown example, a first pixel is topped with a green filter (G) and a second neighboring pixel is topped with a blue filter (B). Microlenses 17 are formed on top of filtering layer 15, in front of substrate portions 3a containing the photodiodes.

Regions 7 have the function of insulating substrate portions 3a and 3b from one another. They especially enable avoiding that electrons generated in a given substrate portion 3a, due to the illumination of this substrate portion, are collected by a photodiode of another substrate portion.

Strips 5 and 6 form a junction which enables to limit so-called dark currents. Such parasitic currents are due to the spontaneous random generation of electron-hole pairs at the level of certain defects of the crystal structure of the substrate. They are capable of appearing and of being collected by photodiodes, even in the absence of any illumination of the sensor, and thus disturb the sensor operation. In particular, on the rear surface side of the sensor (in layer 6), at the interface between the substrate and insulating layer 11, crystal defects created at the time when the substrate is thinned down are capable of generating dark currents. The PN junction formed on the rear surface side of the substrate enables to block these currents, so that parasitic electrons are not collected by the photodiodes (the junction is not conductive from layer 6 to substrate 3).

To form such a sensor, it is started from a substrate of standard thickness, for example, with a thickness approximately ranging from 600 to 800 μm. Regions 7 are formed from the front surface of the substrate. They, for example, are implanted regions of same conductivity type as the substrate but of higher doping level, or deep trenches filled with silicon oxide. The photodiodes and the various control transistors of the sensor are also formed from the front surface of the substrate, inside and on top of substrate portions 3a and 3b. After the forming of regions 7 and of the various sensor components, the front surface of the substrate is coated with interconnection stack 9, and a holding handle (not shown) is bonded to the upper surface of this stack. The substrate is then thinned to obtain the desired thickness. It should be noted that lateral insulation regions 7 may extend all the way to the rear surface of the thinned substrate or down to an intermediary depth. After the thinning, strip 5 is formed by implantation of dopant elements of same conductivity type as the substrate, from the thinned surface (rear surface) of the substrate. Then, strip 6 is formed above strip 5, by implantation of dopant elements of a conductivity type opposite to that of the substrate. Insulating layer 11, antireflection layer 13, filtering layer 15, and microlenses 17, are then successively formed on the rear surface side of the substrate.

A disadvantage of this type of sensor is the need to provide, after the thinning step, two successive steps of implantation of dopant elements from the rear surface of the substrate. At this stage of the manufacturing, the front surface of the substrate is coated with stack 9, especially comprising metal layers, for example, made of copper. There thus is a risk of contamination of the implantation equipment by the interconnection metals. In practice, this forces to use implantation equipment specifically dedicated to the forming of strips 5 and 6, separate from the equipment already provided to perform implantations from the front surface of the substrate.

Further, after each implantation, an anneal at a high temperature, for example of at least 650° C., is necessary to activate the dopant elements. A standard anneal, comprising homogeneously heating the sensor assembly, is not adapted since it would result in damaging the components already formed on the front surface side. A laser surface anneal of the rear surface, enabling to strongly raise the rear surface temperature while maintaining an acceptable temperature in the upper portion of the substrate, is thus provided. Such an anneal has the disadvantage of being particularly expensive to implement, and requires specific equipment.

Further, such a manufacturing process comprising an implantation followed by a laser anneal does not enable to obtain a strip 6 having a thickness lower than from 10 to 100 nm. This results in an alteration of the sensor sensitivity, especially for wavelengths in the blue or ultraviolet ranges, for which the photons are absorbed by very small silicon thicknesses. Indeed, when strip 6 is too thick, photons may be absorbed in this strip. The electrons generated during this absorption then have the same fate as the parasitic electrons of dark currents, that is, they are trapped by the PN junction formed between strips 5 and 6, and are thus not collected by a photodiode.

SUMMARY

Thus, an embodiment aims at providing a method for forming a back-side illuminated image sensor, which at least partly overcomes some of the disadvantages of usual solutions.

An embodiment aims at providing such a method enabling to do away with a step of implantation of dopant elements from the rear surface of the substrate.

An embodiment aims at providing such a method enabling to do away with a step of laser anneal of the rear surface of the substrate.

Another embodiment aims at providing a back-side illuminated image sensor, which at least partly overcomes some of the disadvantages of usual sensors.

An embodiment aims at providing such a sensor having a better sensitivity than usual sensors, especially for wavelengths with a small penetration into silicon.

Thus, an embodiment provides a method for forming a back-side illuminated image sensor from a semiconductor substrate comprising, stacked on each other, a first layer of a first doping level on the rear surface side, and a second layer of same conductivity type as the first layer but of lower doping level on the front surface side, this method comprising the steps of: a) forming, from the front surface, doped polysilicon regions, of a conductivity type opposite to that of the substrate, extending in depth orthogonally to said front surface and emerging into the first layer; b) thinning the substrate from its rear surface to reach the polysilicon regions, while keeping a strip of the first layer; c) depositing, on the rear surface of the thinned substrate, a doped amorphous silicon layer, of a conductivity type opposite to that of the substrate; and d) annealing at a temperature capable of transforming said amorphous silicon layer into a crystallized layer.

According to an embodiment, the anneal is performed in the same equipment as that used, at step c), for the deposition of said amorphous silicon layer.

According to an embodiment, the anneal temperature ranges from 350 to 450° C.

According to an embodiment, the thickness of the amorphous silicon layer ranges between 1 and 10 nm.

According to an embodiment, the forming of the polysilicon regions comprises the opening of trenches in the substrate and the filling of these trenches with polysilicon, an intermediary step of implantation of dopant elements, of same conductivity type as the second layer but of higher doping level being provided after the etching of the trenches but before their filling.

Another embodiment provides a back-side illuminated image sensor formed inside and on top of a thinned semiconductor substrate, wherein: a layer of same conductivity type as the substrate but of higher doping level extends from the rear surface of the substrate; a layer of a conductivity type opposite to that of the substrate extends across a small thickness and over the entire rear surface of the sensor; and doped polysilicon regions, of a conductivity type opposite to that of the substrate, extend orthogonally from the front surface of the substrate to the front surface of said layer of a conductivity type opposite to that of the substrate.

According to an embodiment, a layer of same conductivity type as the substrate but of higher doping level extends at the interface between the polysilicon regions and the substrate.

According to an embodiment, contacting areas are formed on the front surface side of the polysilicon regions, enabling, in operation, to bias these regions and the layer of a conductivity type opposite to that of the substrate.

According to an embodiment, the layer of a conductivity type opposite to that of the substrate has a thickness ranging between 1 and 10 nm.

According to an embodiment, the polysilicon regions delimit substrate portions containing photodiodes and control transistors of the sensor.

The foregoing and other objects, features, and advantages will be discussed in detail in the following non-limiting description of specific embodiments in connection with the accompanying drawings.

DETAILED DESCRIPTION

Figure 1:
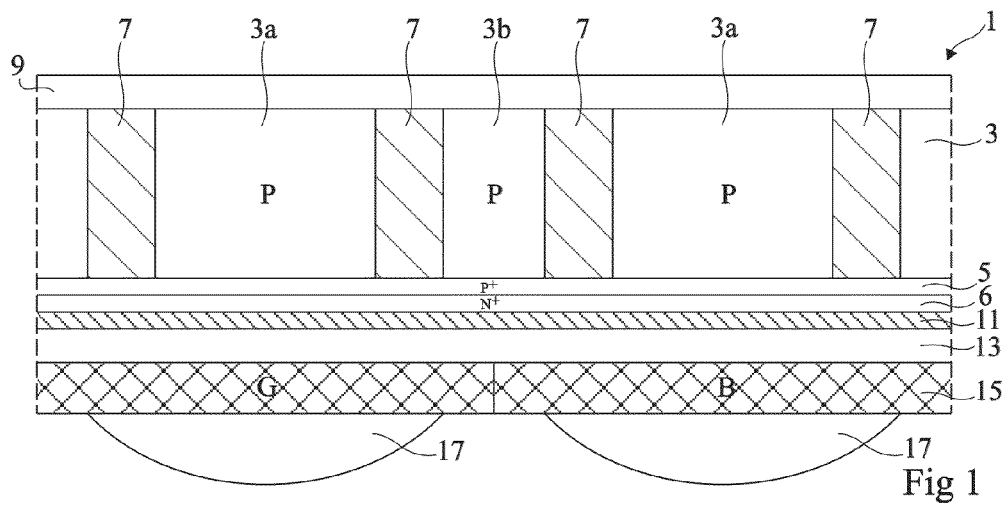
FIG. 1, previously described, is a cross-section view schematically and partially showing a back-side illuminated image sensor.

For clarity, the same elements have been designated with the same reference numerals in the different drawings and, further, as usual in the representation of integrated circuits, the various drawings are not to scale.

FIGS. 2A to 2E are partial simplified cross-section views illustrating steps of an embodiment of a method for forming a back-side illuminated image sensor 31.

Figure 2A:
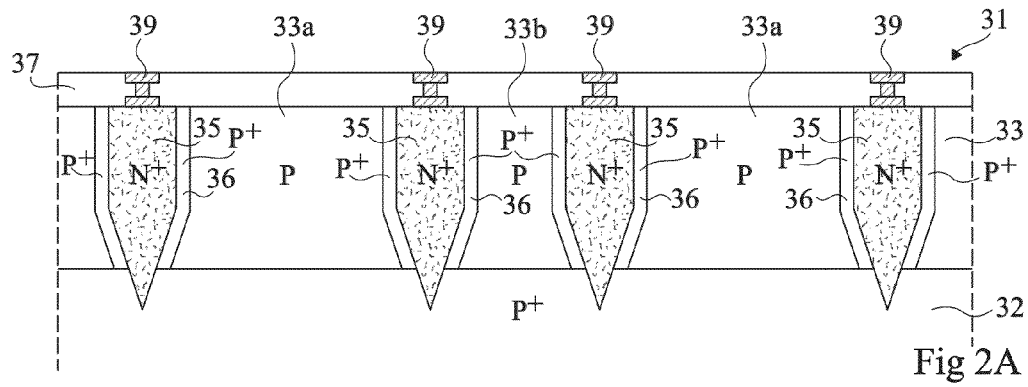
FIGS. 2A to 2E are partial simplified cross-section views illustrating steps of an embodiment of a method for forming a back-side illuminated image sensor.

FIG. 2A illustrates the forming of various sensor components from the front surface of a semiconductor substrate of standard thickness. In this example, the substrate comprises a heavily-doped P-type solid silicon support 32 (P+), coated with a lightly-doped P-type epitaxial layer 33 (P). Support 32 may have a thickness of a few hundreds of μm, for example ranging between 600 and 800 μm, and epitaxial layer 33 may have a thickness of a few μm, for example ranging between 1 and 10 μm.

Doped polysilicon regions 35, of a conductivity type opposite to that of the substrate (that is, of type N in this example), are formed in the upper portion of the substrate. Regions 35 extend from the front surface of the substrate and orthogonally to this surface, and extend into P+-type support 32. It should be noted that "perpendicularly" here means substantially perpendicularly, for example, forming an angle ranging between 70 and 120 degrees with the front surface. In the shown example, regions 35 have a tapered shape ending in a point in support 32. In top view (not shown), regions 35 delimit a plurality of substrate portions 33a and 33b, for example, rectangular. Each portion 33a is intended to comprise at least one photodiode and may comprise charge transfer devices (not shown), corresponding to a sensor pixel, and each portion 33b is intended to comprise one or several control transistors (not shown). To form regions 35, trenches are opened in the substrate down to the desired depth, for example, by local etching, and filled with doped polysilicon. After the etching, but before the filling, dopant elements may be implanted from the internal walls of the trenches, to create, at the interface between substrate 33 and polysilicon 35, a thin layer 36 of same conductivity type as the substrate but of greater doping level. The photodiodes and the control transistors are formed from the front surface, inside and on top of substrate portions 33a and 33b.

After the forming of regions 35, of the photodiodes, and of the control transistors, the front surface of substrate 33 is covered with a stack 37 of insulating and conductive layers where the various interconnections of the sensor are formed. In particular, in the shown example, each region 35 is topped with a biasing contacting area 39, contacting its front surface.

The interconnection tracks and vias, other than those forming areas 39, have not been shown in the drawings.

Figure 2B:
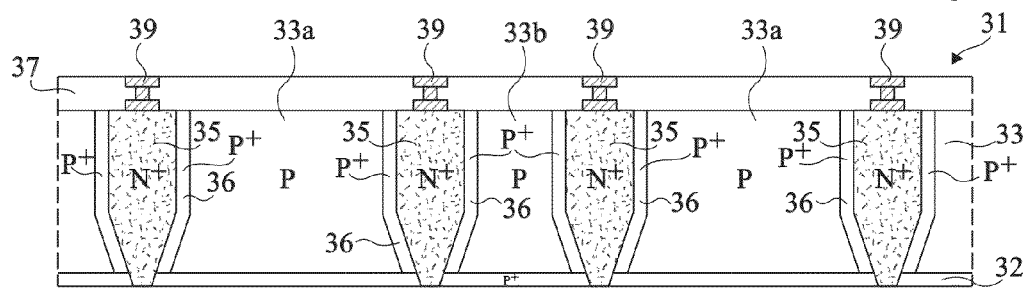

FIG. 2B illustrates a substrate thinning step, subsequent to the forming of stack 37. A holding handle (not shown) is bonded to the upper surface of stack 37, and the substrate is thinned from its rear surface to reach polysilicon regions 35, while keeping a thin strip of P+-type support 32. As an example, the thickness of the support strip 32 which has been kept ranges from 10 to 200 nm. The thinning may be carried out in two steps, that is, a grinding step, followed by a chem.-mech. polishing step (CMP). At the end of the thinning, substrate portions 33a and 33b are totally insulated from one another by regions 35 which are exposed on the rear surface side of the thinned substrate.

Figure 2C:
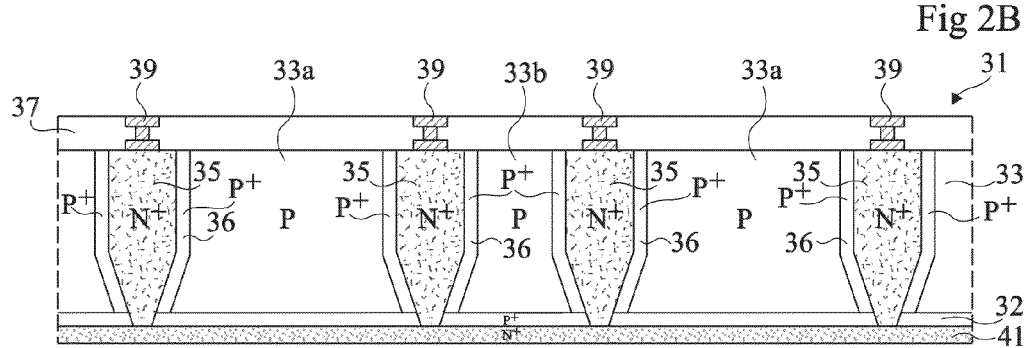

FIG. 2C illustrates a step subsequent to the thinning, during which a doped amorphous silicon layer 41 of a conductive type opposite to that of the substrate (that is, of type N in the present example), is deposited over the entire rear surface of the thinned substrate. An advantage of amorphous silicon is that it can be deposited at low temperature, heavily doped, and in a very thin layer. As an example, the doping level of layer 41 is of the same order as the doping level of regions 35, and the thickness of layer 41 ranges between 1 and 10 nm.

Figure 2D:
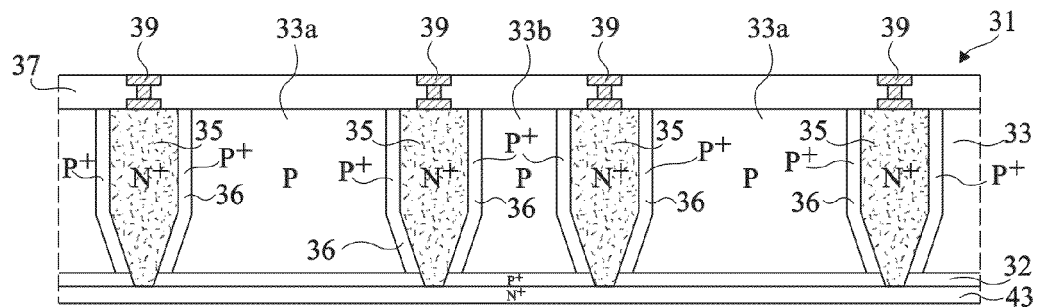

FIG. 2D illustrates a subsequent anneal step, transforming amorphous silicon layer 41 into a crystallized layer 43. The anneal is preferably performed in the same equipment as that used for the amorphous silicon deposition. The temperature is selected to be sufficiently high to enable the recrystallization and sufficiently low to avoid damaging the components already formed. It may be between 350° C. and 450° C., for example, on the order of from 420 to 430° C. In all cases, this temperature is much lower than the necessary temperature, in the method for forming the sensor of FIG. 1, to activate the dopant elements implanted from the rear surface of the thinned substrate. At the end of the anneal, a stable silicon layer 43 is thus obtained, of a conductivity type opposite to that of the substrate and of a thickness substantially equal to the thickness of the initially-deposited amorphous silicon layer 41, for example, approximately ranging between 1 and 10 nm. Layer 43 forms, with layer 32, a PN junction especially enabling to limit dark currents due to the inevitable presence of crystal defects at the level of the rear surface of the substrate. Layer 43 being in contact with the rear surface of polysilicon regions 35, it may be biased via contacting areas 39, at the same time as regions 35.

Figure 2E:
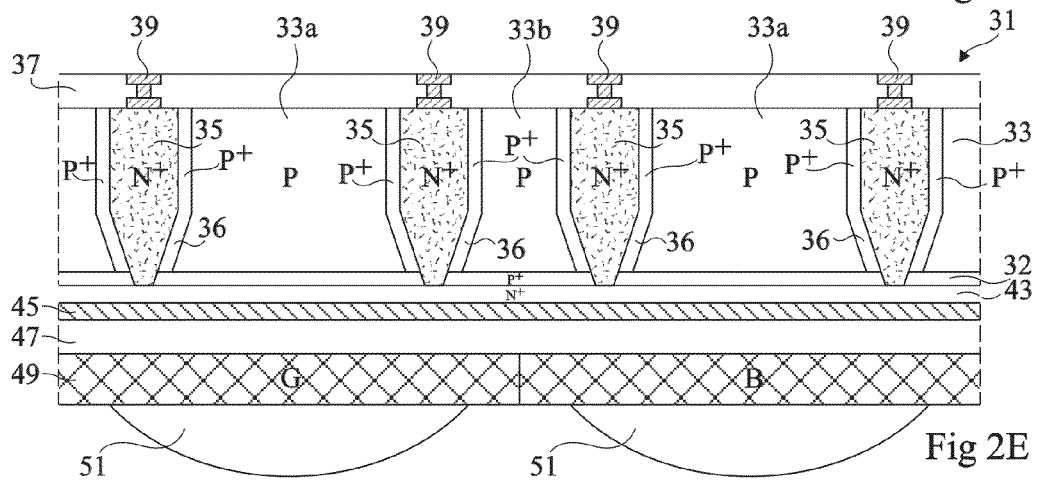

FIG. 2E illustrates final steps of the forming of sensor 31, corresponding to conventional steps of the forming of a backside illuminated image sensor. In this example, a thin insulating layer 45, an antireflection layer 47, a filtering layer 49, and microlenses 51 are successively formed on the rear surface side of the sensor.

In a sensor formed according to the provided method, the rear surfaces and the lateral surfaces of substrate portions 33a and 33b are entirely coated with regions of a conductivity type opposite to that of the substrate (N in the present example). Substrate portions 33a and 33b are thus entirely insulated by a PN junction. This enables to block dark currents, not only at the level of the rear surface of the substrate, but also at the level of the interfaces between lateral insulation regions 35 and the substrate.

The biasing of the N region to a common voltage may be ensured via contacting areas 39. As an example, it may be provided, in operation, to bias N-type regions 35 and 43 (via contacting areas 39) to a positive voltage with respect to the voltage of substrate 33 and of P-type regions 36 and 32. This enables to drain off the parasitic electrons collected by the PN junction.

It should be noted that an advantage of the provided structure is that, to achieve such a biasing, it is not necessary to provide a contacting area on the sensor side exposed to light (rear surface).

An advantage of the provided manufacturing method is that it enables to perform a junction insulation of the rear surface of the substrate, without for all this to provide any step of implantation of dopant elements from the rear surface of the sensor.

Another advantage of this method is that the forming of layers 32 and 43 does not require providing a laser anneal of the rear surface of the substrate.

Another advantage of this method is that layer 43 thus formed may be much thinner than layers formed by implantation, such as layer 6 of the sensor described in relation with FIG. 1. This enables to increase the sensor sensitivity, especially for wavelengths with a small penetration into silicon.

Other substrate types may be used to form a sensor of the type illustrated in FIG. 2E.

Figure 3A:
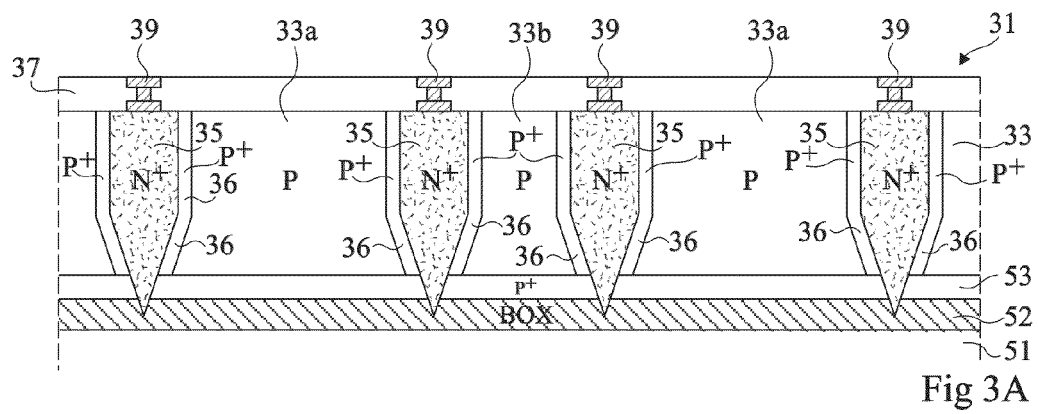
FIGS. 3A and 3B are partial simplified cross-section views illustrating steps of an alternative embodiment of the method described in relation with FIGS. 2A to 2E.
Figure 3B:
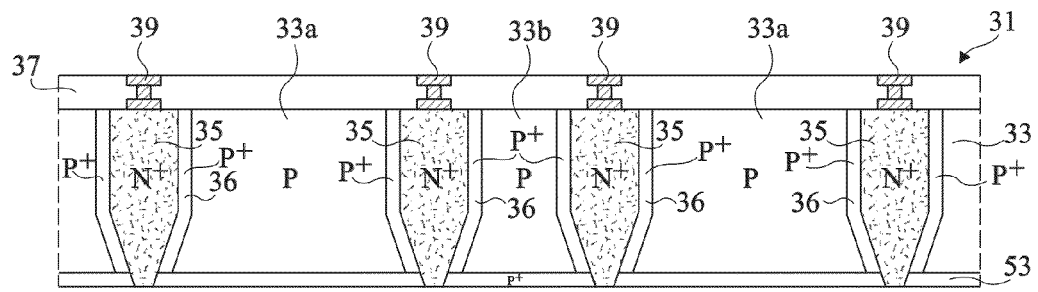

FIGS. 3A and 3B are partial simplified cross-section views illustrating steps of an alternative embodiment of the method described in relation with FIGS. 2A to 2E, where the initial substrate is of SOI type ("Silicon On Insulator"). This substrate comprises, stacked in the following order, a support 51, for example, made of silicon, an insulating layer 52 (BOX), for example, made of silicon oxide, a thin heavily-doped P-type epitaxial silicon layer 53 (P+), and a lightly-doped P-type epitaxial silicon layer 33. Support 51 may have a thickness of a few hundreds of μm, for example ranging between 600 and 800 μm, insulating layer 52 may have a thickness approximately ranging between 10 and 200 nm (typically 145 nm), thin layer 53 may have a thickness approximately ranging between 10 and 200 nm, and layer 33 may have a thickness of a few μm, for example, ranging between 1 and 10 μm.

FIG. 3A illustrates the forming of various sensor components from the front surface side of the substrate. In particular, doped polysilicon regions 35 of a conductivity type opposite to that of the substrate are formed in the upper portion of the substrate, extending from the front surface of layer 33, perpendicularly to this surface, to reach insulating layer 52. In the shown example, regions 35 have a tapered shape ending in a point in insulating layer 52. As previously, a thin layer 36 of same conductivity type as the substrate but of greater doping level is formed, separating regions 35 from substrate portions 33a and 33b intended to comprise photodiodes and control transistors.

After the forming of regions 35, of the photodiodes, and of the control transistors, the front surface of substrate 33 is covered with a stack 37 of insulating and conductive layers where the various interconnections of the sensor are formed. In particular, biasing contacting areas 39 contact the front surfaces of at least some regions 35.

FIG. 3B illustrates a substrate thinning step, subsequent to the forming of stack 37. A holding handle (not shown) is bonded to the upper surface of stack 37, and the substrate is thinned from its rear surface to reach insulating layer 52. Layer 52 can then be easily removed, for example, by selective etching of the silicon oxide over the substrate.

At the end of this thinning step, the obtained structure (FIG. 3B) is similar to the structure obtained at the step of FIG. 2B. The subsequent sensor forming steps are similar to those described in relation with FIGS. 2C to 2E and will not be described again.

Specific embodiments of the present invention have been described. Various alterations, modifications and improvements will readily occur to those skilled in the art.

In particular, embodiments are not limited to the example described in relation with FIGS. 2A to 2E where the sensor is formed from a P-type substrate. It will be within the abilities of those skilled in the art to adapt the provided method to form a sensor from an N-type substrate, especially by inverting the conductivity type of regions 35, 36, 32, and 43.

Besides, embodiments are not limited to the described example, where contacting areas 39 are provided on the front surface of each of polysilicon regions 35. It will be within the abilities of those skilled in the art to provide other configurations, and especially to decrease the number of contacting areas provided for the biasing of the PN junction.

It should further be noted that a step of surface laser anneal may be provided, if the quality of layer 43 (FIG. 2D) is desired to be improved, as a complement or instead of the crystallization anneal of amorphous silicon layer 41.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A back-side illuminated image sensor, comprising:
   semiconductor substrate of a first conductivity type having a front surface and a rear surface;
   a first semiconductor layer of the first conductivity type extending on the rear surface of the substrate, the first semiconductor layer having a higher doping level than the substrate, a front surface on the substrate, and a rear surface;
   a second semiconductor layer of a second conductivity type, opposite to the first conductivity type, extending on the rear surface of the first semiconductor layer, the second semiconductor layer having a front surface, on the rear surface of the first semiconductor layer, and a rear surface; and
   doped polysilicon regions, of the second conductivity type, extending orthogonally from the front surface of the substrate to the front surface of said second semiconductor.

2. The sensor of claim 1, further comprising third semiconductor layers of the first conductivity type extending between the polysilicon regions and the substrate and separating the polysilicon regions from the substrate, the third semiconductor layers having a higher doping level than the substrate.

3. The sensor of claim 2, wherein:
   said third semiconductor layers contact the first semiconductor layer;
   the first and second semiconductor layers form a first PN junction that insulates a the rear surface of the substrate from dark currents; and
   the polysilicon portions and third semiconductor layers form second PN junctions that laterally insulate portions of the substrate photodiodes and control transistors of the sensor.

4. The sensor of claim 1, further comprising contacting areas positioned directly on front surfaces of said polysilicon regions, enabling, in operation, to bias said polysilicon regions and said second semiconductor layer.

5. The sensor of claim 1, wherein said second semiconductor layer has a thickness ranging between 1 and 10 nm.

6. The sensor of claim 1, wherein said polysilicon regions delimit substrate portions containing photodiodes and control transistors of the sensor.

7. The sensor of claim 1, wherein the first and second semiconductor layers form a first PN junction that insulates the rear surface of the substrate from dark currents.

8. The sensor of claim 1, further comprising:
   an insulating layer on the rear surface of the second semiconductor layer;
   an antireflection layer on the insulating layer;
   a filtering layer on the antireflection layer; and
   microlenses on the filtering layer.

* * * * *